US 6,580,175 B1

(12) United States Patent
Lee

(10) Patent No.: US 6,580,175 B1
(45) Date of Patent: Jun. 17, 2003

(54) SEMICONDUCTOR LAYOUT STRUCTURE FOR A CONDUCTIVE LAYER AND CONTACT HOLE

(75) Inventor: Kweon-Jae Lee, Kyonggi-do (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/710,833

(22) Filed: Nov. 14, 2000

(30) Foreign Application Priority Data

Nov. 15, 1999 (KR) ............................................ 99-50542

(51) Int. Cl.$^7$ ........................ H01L 29/41; H01L 23/528; H01L 29/78; H01L 23/48
(52) U.S. Cl. ........................ 257/786; 257/296; 257/300; 257/306; 257/308; 257/309; 257/784; 257/690; 257/698
(58) Field of Search ..................... 257/296, 300, 257/306, 308, 309, 773, 774, 734, 784, 6, 690, 8; 361/303; 438/629, 637, 639, 640, 666, 667, 668, 672, 675, 700, 707, 713, 978

(56) References Cited

U.S. PATENT DOCUMENTS

| 5,309,386 A | * | 5/1994 | Yusuki et al. .................. 365/51 |
| 5,686,746 A | * | 11/1997 | Iwasa .......................... 257/296 |
| 5,742,086 A | * | 4/1998 | Rostoker et al. ............ 257/300 |

FOREIGN PATENT DOCUMENTS

JP             409199841 A    *  7/1997    ............ H05K/3/34

* cited by examiner

Primary Examiner—John F. Niebling
Assistant Examiner—Johannes P Mondt
(74) Attorney, Agent, or Firm—Lee & Sterba, P.C.

(57) ABSTRACT

The present invention discloses a layout in a semiconductor device having conductive layers electrically connected to conductive regions via contact holes beneath the conductive layers. Each of the conductive layers has a layout with different widths at opposite longitudinal ends thereof, respectively, thereby being capable of achieving an improvement in the alignment margin between the conductive layer and the contact hole within a given memory cell area. Where the layout is applied to capacitors, it is possible to avoid the formation of inferior storage electrodes over regions where contact holes are formed.

9 Claims, 7 Drawing Sheets

SEMICONDUCTOR LAYOUT STRUCTURE FOR A CONDUCTIVE LAYER AND CONTACT HOLE

BACKGROUND OF THE INVENTION

1. Field of the Invention

The present invention relates generally to a semiconductor device. More particularly, the present invention relates to a layout structure for a conductive layer and contact hole in a semiconductor device.

2. Description of the Related Art

Integrated circuits are typically manufactured by patterning a series of laminated masking layers. Such a masking layer includes features which are related to features on other masking layers. Each layer level in the manufacture of an integrated circuit should be spatially aligned with a previous layer level. Thus, a mask pattern to be formed on a wafer in a photolithography process should be aligned with a pattern previously formed on the wafer. masking layers. Such a masking layer includes features which are related to features on other masking layers. Each layer level in the manufacture of an integrated circuit should be spatially aligned with a previous layer level. Thus, a mask pattern to be formed on a wafer in a photolithography process should be aligned with a pattern previously formed on the wafer.

Recently, the design rule of highly integrated semiconductor memory devices has been reduced from approximately 1 μm, the level of mega-bit grade DRAMs, to approximately 0.15 μm, the level of giga-bit grade DRAMs. The design rule is a factor associated with a process limitation. In particular, the alignment tolerance in the deep submicron design rule is an important factor for determining a fatal failure of devices. Thus, the alignment margin of a pattern formed in a pre-process or post-process with a reduced design rule has been highlighted.

In the case of a dynamic random access memory (DRAM), a reduction in memory cell pitch results in a reduction in the alignment margin between a contact hole, serving to electrically connect the source region of an associated transistor to the storage electrode of an associated capacitor, and the storage electrode formed over the contact hole. Such a reduction in the alignment margin may be a major factor causing a degradation of the device.

FIG. 1 is a plan view showing the layout of a storage electrode in a capacitor manufactured with a conventional method, and FIG. 2 is a cross-sectional view taken along the line 2—2 in FIG. 1. An insulating material such as an oxide is deposited over a semiconductor substrate 10 previously formed with conductive elements such as transistors and bit lines, thereby forming an insulating layer 12 over the semiconductor substrate 10. The insulating layer 12 is then etched using a photo-etch process, thereby forming contact holes 14 for exposing conductive regions of the substrate 10, for example, source regions (not shown) of respective transistors.

Subsequently, a conductive layer 16 such as a doped polysilicon layer is deposited over the resulting structure to a desired thickness from the upper surface of the insulating layer 12, with a chemical vapor deposition method, such that each contact hole 14 is completely buried by the conductive layer 16. The conductive layer 16 is then etched using a photo-etch process, thereby forming respective storage electrodes of capacitors. Each storage electrode denoted by the reference numeral 16 is electrically connected to the source region of an associated one of the transistors through an associated one of the contact holes 14. As shown in FIG. 1, each storage electrode 16 has a linear layout when viewed in a plan view. Thus, storage electrodes 16 are repetitively arranged while being spaced apart from one another by a uniform distance.

In the structure according to the above described conventional method, when each storage electrode has a reduced size to obtain an increased integration degree, the alignment margin (denoted by the reference character L in FIGS. 1 and 2) between the storage electrode and the contact hole under the storage electrode may be insufficient. This is because it is difficult to reduce the size of the contact hole to a desired extent due to a process limitation involved in the photolithography process. In such a case, there is a problem in that the storage electrode may be excessively etched at the open end of the contact hole in the etch process for forming the storage electrode.

FIG. 3 is a scanning electron microscope (SEM) photograph showing an inferior electrode pattern resulting from an insufficient alignment margin between the storage electrode and the contact hole. Referring to FIG. 3, the contact hole is not completely covered by the storage electrode at the open end thereof. As a result, there may be a leakage of cell capacitance at the portion of the contact hole not covered by the storage electrode.

To solve the above-described problem, attempts to reduce the size of the contact hole to a process limit in the photolithography process or below have been made. However, such methods are problematic in that the contact hole may not be completely open.

To protect the contact hole from the etch process for forming the storage electrode, a method has been proposed in which nitride film spacers serving to prevent the contact hole from being etched are respectively formed at opposite side walls of the contact hole prior to the deposition of a conductive layer for the storage electrode. This method, however, involves a drawback in that the number of processes used increases. Furthermore, the nitride film spacers may serve as a source of diverse defects.

SUMMARY OF THE INVENTION

A feature of the present invention is to provide a layout in a semiconductor device capable of achieving an improvement in the alignment margin between a conductive layer and a contact hole under the conductive layer pattern.

The present invention provides a semiconductor device including: a conductive region and a conductive element electrically connected to the conductive region via a contact hole beneath the conductive element, the conductive element defining a first longitudinal end and a second longitudinal end opposite the first longitudinal end, the first longitudinal end defining a first width and the second longitudinal end defining a second width different from the first width. In one embodiment of the present invention, the first width is larger than a width of the contact hole and the second width is smaller than the first width. Additionally, the second width is smaller than the width of the contact hole. Further, the first width is larger than the second width and a distance between the contact hole and the first end is less than a distance between the contact hole and the second end. Further still, the conductive element defines a trapezoid.

The present invention also provides a semiconductor device including: a plurality of conductive regions and a plurality of conductive elements on a common plane, each element connected to a respective conductive region via a respective contact hole beneath the conductive element, each element defining a first longitudinal end and a second longitudinal end opposite the first longitudinal end, the first longitudinal end defining a first width and the second longitudinal end defining a second width smaller than the first width, each element oriented such that the first end is opposite the second end of an adjacent element, and the second end is opposite the first end of the adjacent element. In one embodiment, the conductive element defines a trapezoid and a distance between the contact hole and the first end is less than a distance between the contact hole and the second end.

The present invention further provides a semiconductor device including: a conductive region and a capacitor including: a first electrode electrically connected to the conductive region via a contact hole beneath the first electrode, the first electrode defining a first longitudinal end and a second longitudinal end opposite the first longitudinal end, the first longitudinal: end defining a first width and the second longitudinal end defining a second width different from the first width and a second electrode laminated over the first electrode such that a dielectric element is interposed between the first and second electrodes. In one embodiment of the present invention, the first width is larger than a width of the contact hole and the second width is smaller than the first width. Additionally, the second width is smaller than the width of the contact hole. Further, the first width is larger than the second width and a distance between the contact hole and the first end is less than a distance between the contact hole and the second width. In addition, the first electrode defines a trapezoid.

The present invention still further provides a semiconductor device including: a plurality of conductive regions; a plurality of first electrodes on a common plane, each first electrode connected to a respective conductive region via a respective contact hole beneath the first electrode, each first electrode defining a first longitudinal end and a second longitudinal end opposite the first longitudinal end, the first longitudinal end defining a first width and the second longitudinal end defining a second width smaller than the first width, each first electrode oriented such that the first end is opposite the second end of an adjacent first electrode, and the second end is opposite the first end of the adjacent first electrode; and a second electrode laminated over the first electrodes with a dielectric interposed between the first electrodes and second electrode. In one embodiment of the present invention, between the contact hole and the first end is less than a distance between the contact hole and the second end.

The present invention still further provides a layout in a semiconductor device having a conductive layer electrically connected to a conductive region via a contact hole beneath the conductive layer, wherein the conductive layer has a layout with different widths at opposite longitudinal ends thereof, respectively. In one embodiment of the present invention, the conductive has a layout configured such that the width at one of the longitudinal ends thereof is larger than the width of the contact hole, and the width at the other longitudinal end thereof is smaller than the width of the one longitudinal end. Additionally, the conductive layer has a layout configured such that the width of the other longitudinal end thereof is smaller than the width of the contact hole. Further, the conductive layer is repetitively arranged on a common plane to form an array of conductive layers such that the wider and narrower longitudinal ends of one conductive layer face respective wider and narrow longitudinal ends of another conductive layer adjacent to the one conductive layer.

BRIEF DESCRIPTION OF THE DRAWINGS

The above-described features and advantages of the present invention will become more apparent by describing in detail preferred embodiments of the present invention with reference to the attached drawings in which.

DETAILED DESCRIPTION OF THE PREFERRED EMBODIMENT

Preferred embodiments of the present invention will be described in detail with reference to the attached drawings.

Figure 4:
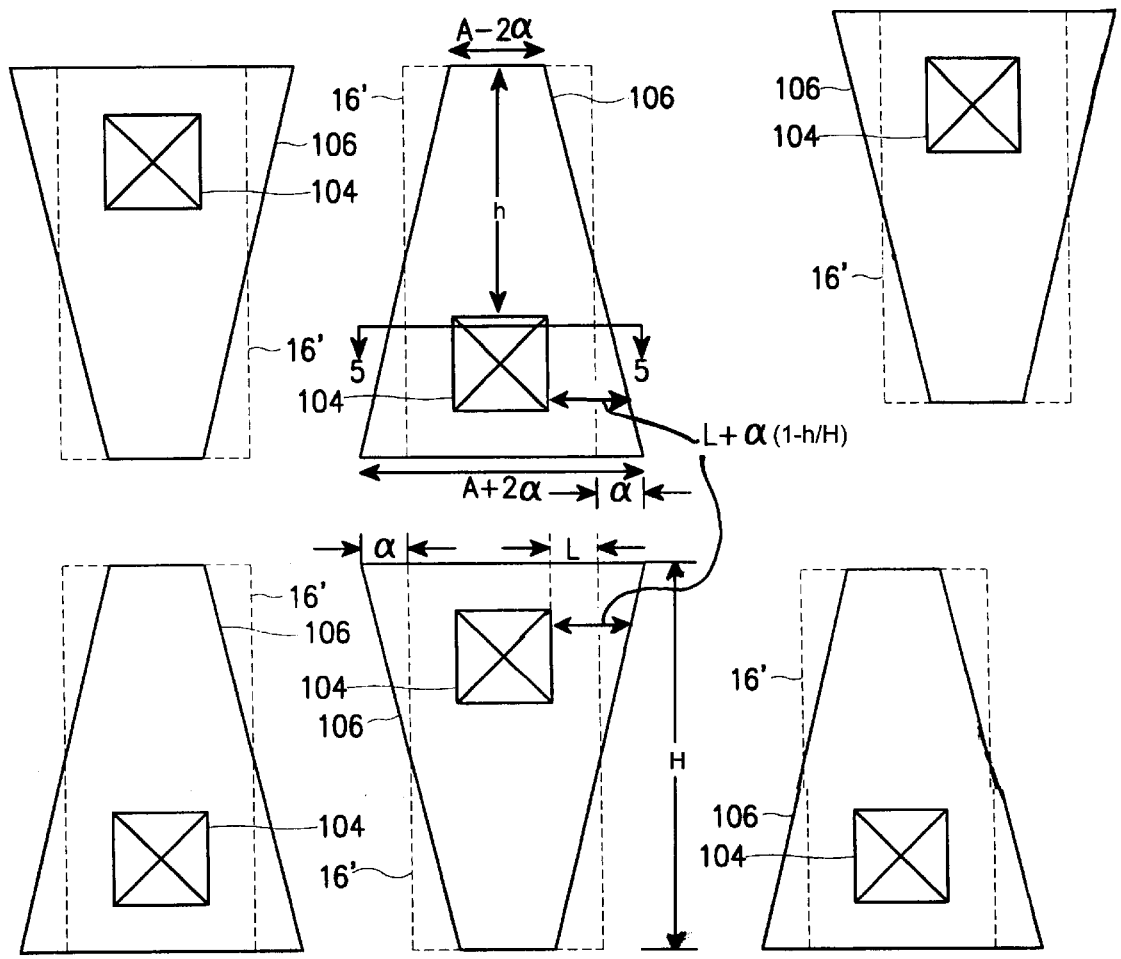
FIG. 4 is a plan view showing a layout structure of a storage electrode in a capacitor manufactured in accordance with the preferred embodiment of the present invention.
Figure 5:
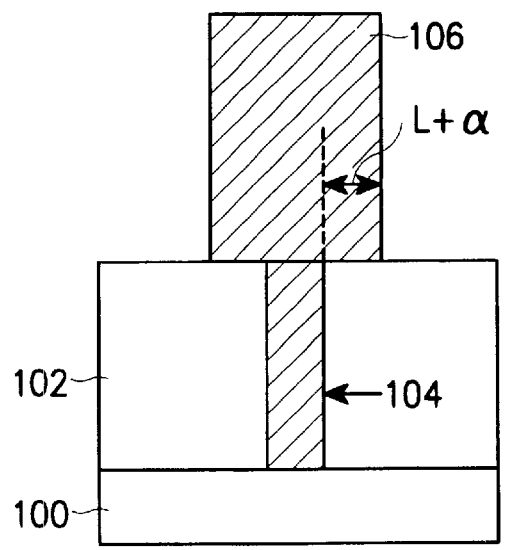
FIG. 5 is a cross-sectional view taken along the line 5—5 in FIG. 4.

FIG. 4 is a plan view showing a layout structure of a storage electrode in a capacitor manufactured in accordance with the preferred embodiment of the present invention, and FIG. 5 is a cross-sectional view taken along the line 5—5 in FIG. 4. Storage electrodes 106 have an asymmetric layout structure defining different widths at opposite longitudinal ends thereof, respectively. In the first preferred pattern of FIG. 4, each electrode 106 defines a trapezoid. Each contact hole 104 serves to electrically connect an associated one of the storage electrodes 106 to a conductive region. For example, the source region of an associated transistor, defined in insulating layer 102 on the upper surface of a semiconductor substrate 100, is under the associated trapezoidal storage electrode 106 such that it is closer to the longer side of the trapezoid (i.e., the longitudinal end of the storage electrode 106 has a larger width).

Each storage electrode 106 may be configured such that it has, at one longitudinal end, a width larger than the width of each contact hole 104 and, at the other longitudinal end, a width smaller than the width of the contact hole 104.

Figure 1:
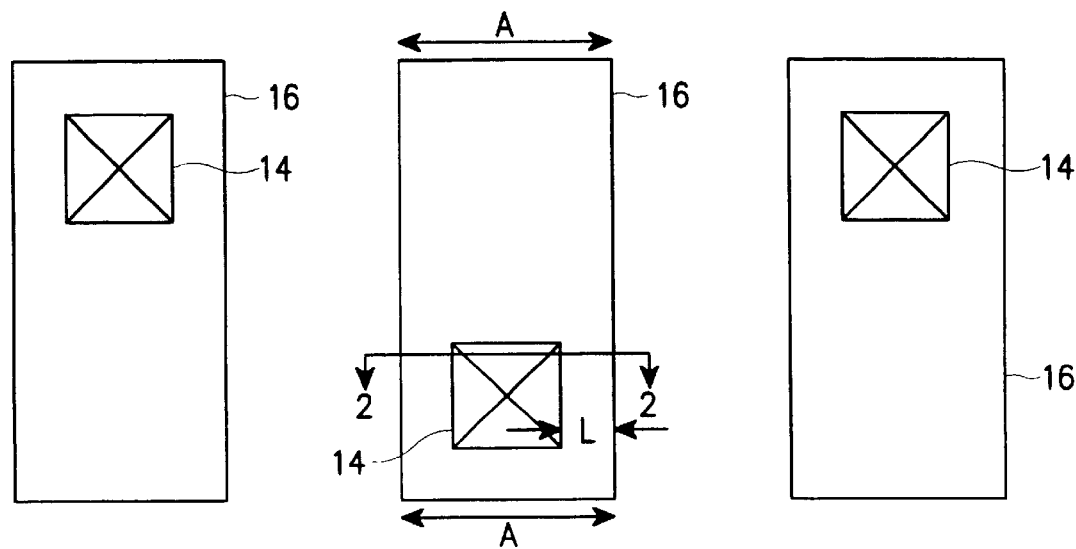
FIG. 1 is a plan view showing the layout of a storage electrode in a capacitor manufactured with a conventional method.
Figure 1:
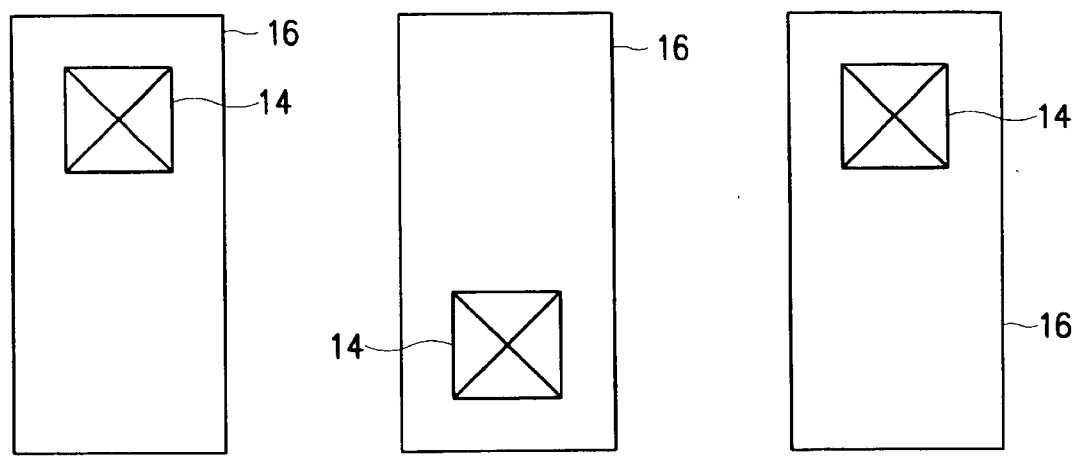
Figure 2:
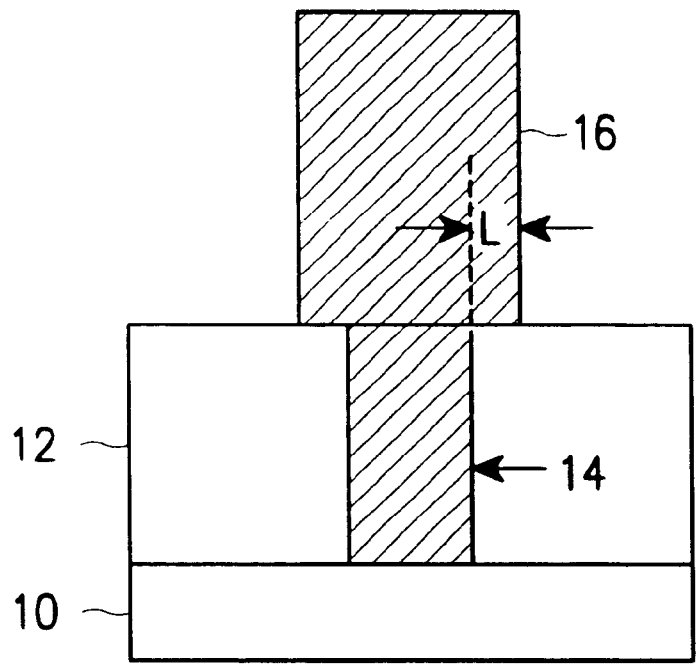
FIG. 2 is a cross-sectional view taken along the line 2—2 in FIG. 1.
Figure 3:
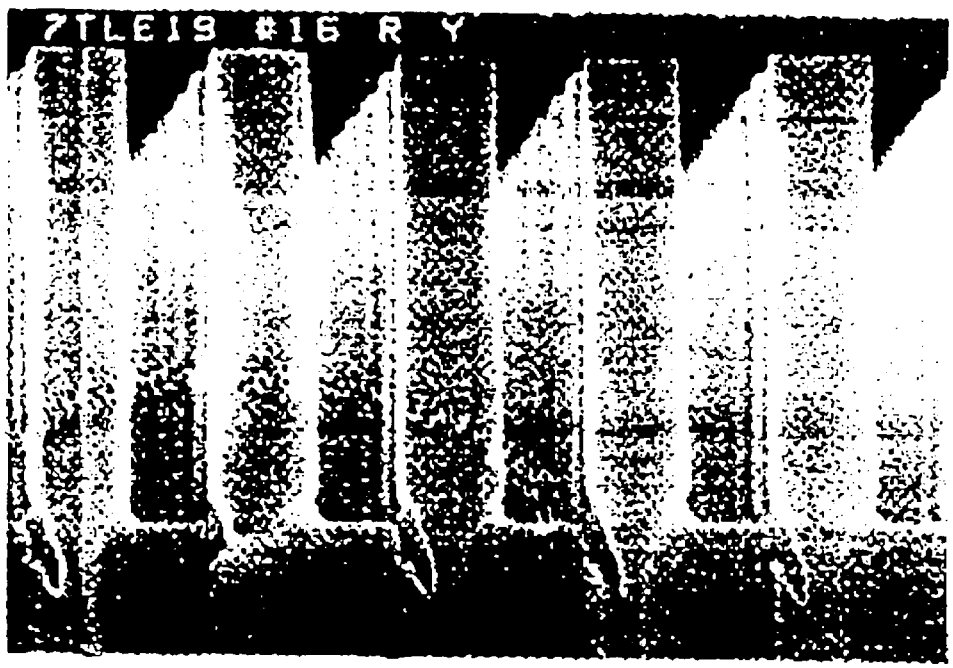
FIG. 3 is a scanning electron microscope (SEM) photograph showing a problem involved in the conventional method.

In FIG. 4, the dotted line 16' represents the dimensions, not the presence, of the conventional storage electrode 16 of FIG. 1. If the alignment margin between the conventional storage electrode 16 and the contact hole under the storage electrode 16 of FIG. 1 is designated "L", the alignment margin between the storage electrode 106 of the preferred embodiment of the present invention and the contact hole 104 under the storage electrode 106 of FIG. 4 corresponds to "L+α (1−h/H)". Stated another way, the alignment margin in the preferred embodiment of the present invention is increased by "α (1−h/H)" which has a limit value as defined as follows: 0<α<A/2.

If the width of the conventional storage electrode 16 is designated "A", the storage electrode 106 of the preferred embodiment of the present invention has a layout structure having a width of "A+2α" at the longer side of the trapezoid structure and a width of "A−2α" at the shorter side of the trapezoid structure. The storage electrodes 106, each having the above-described layout structure, have a pattern in which the storage electrodes 106 are repetitively arranged on the same plane such that the wider and narrower longitudinal ends of each storage electrode face respective wider and narrow longitudinal ends of an adjacent storage electrode. That is, the longer side (A+2α) and shorter side (A−2α) of each trapezoid face respective longer and shorter sides of an adjacent trapezoid. By virtue of such a layout pattern design of the storage electrodes 106, the memory cell area, on which one capacitor is formed, can be the same as that in the conventional structure. Thus, it is possible to improve the alignment margin between each storage electrode 106 and the contact hole 104 under the storage electrode 104 without reduction in cell capacitance.

Figure 6:
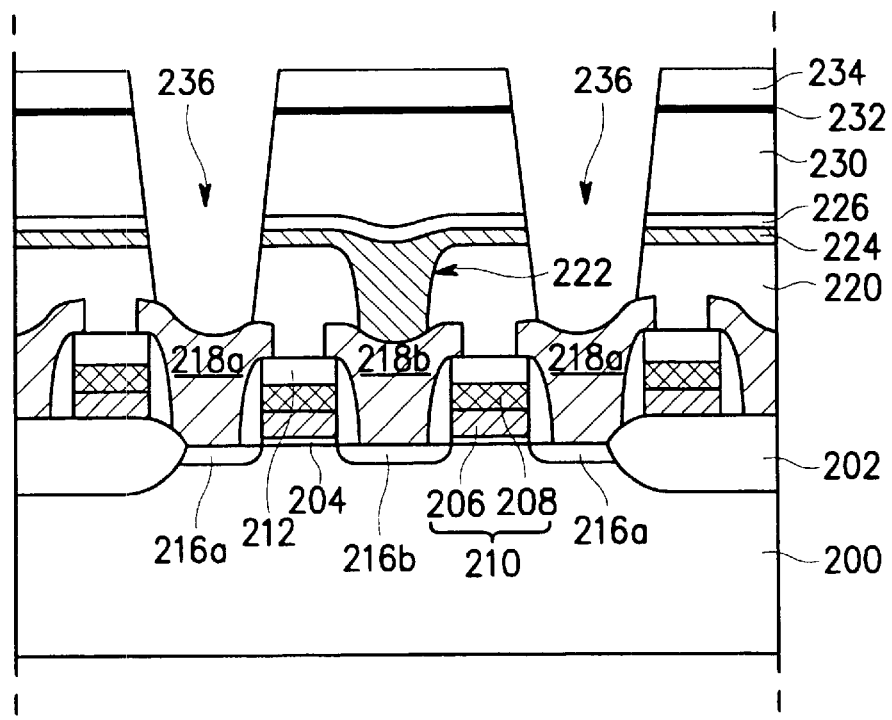
FIGS. 6 to 8 are cross-sectional views showing a method for manufacturing memory cells of a DRAM device to which a layout structure according to the preferred embodiment of the present invention is applied.
Figure 7:
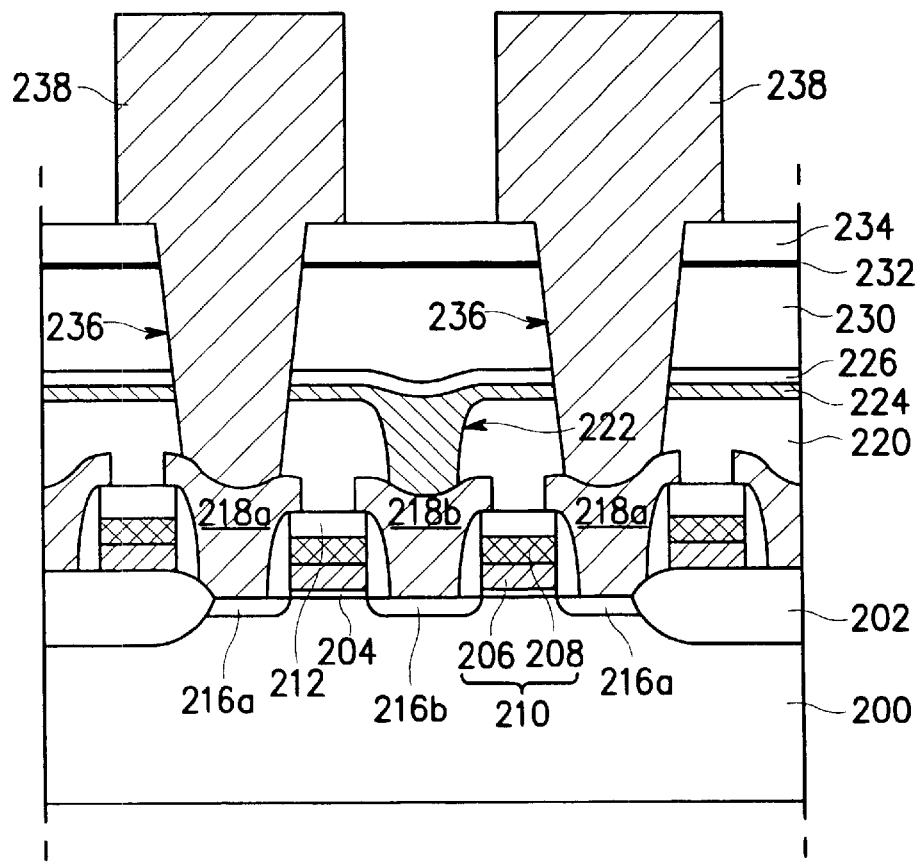
Figure 8:
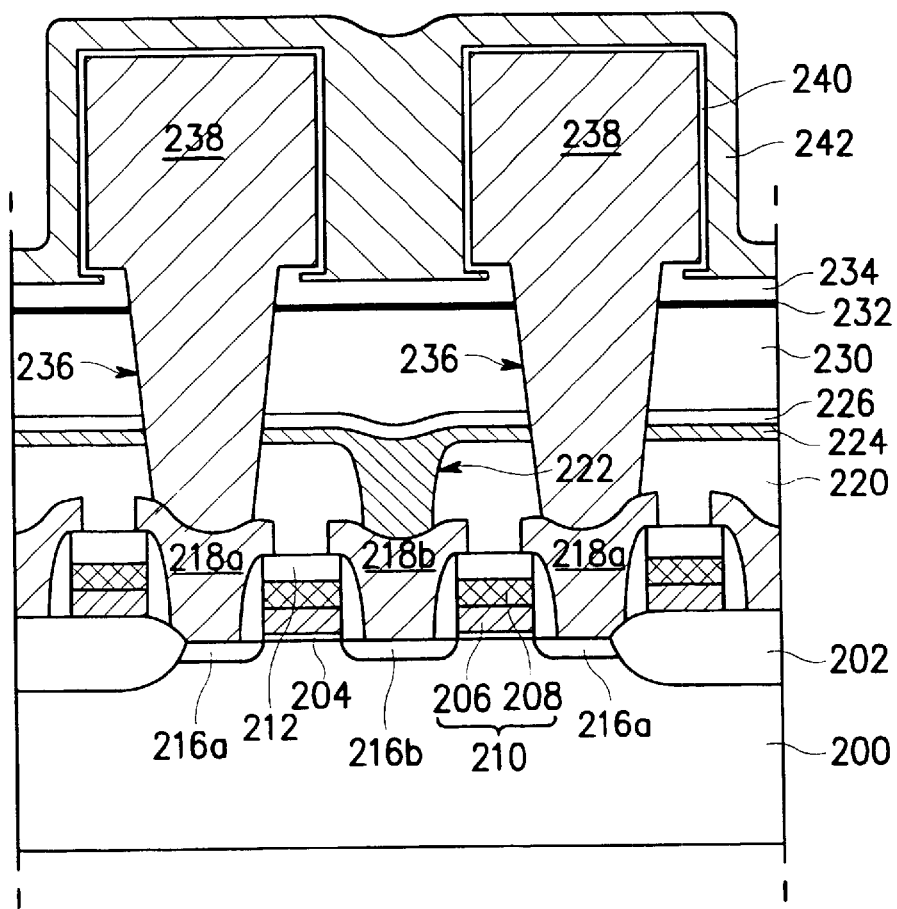

FIGS. 6 to 8 are cross-sectional views respectively showing a method for manufacturing memory cells of a DRAM device to which a layout structure according to the preferred embodiment of the present invention is applied.

FIG. 6 shows the formation of contact holes 236. For the formation of those contact holes 236, a semiconductor substrate 200 is first defined with active regions and field regions by forming a field oxide film 202 on the semiconductor substrate 200 in accordance with a well-known device isolation process. Subsequently, a gate insulating layer 204 is formed. After the formation of the gate insulating layer 204, a polysilicon layer 206, a tungsten silicide layer 208, and a capping layer 212 are deposited in a sequential fashion over the gate insulating layer 204. The polysilicon layer 206 is doped with impurity ions in a high concentration using a well-known doping process, for example, a diffusion process, ion implantation process, or in-situ doping process. For the layer 208, another refractory metal suicide, such as titanium silicide or tantalum silicide, may be used in place of tungsten silicide. Subsequently, the capping layer 212 is patterned in accordance with a photo-etch process to form a gate electrode pattern. Using the patterned capping layer 212 as a mask, the tungsten suicide layer 208 and polysilicon layer 206 are sequentially etched, thereby forming gate electrodes 210 having the polycide structure.

Subsequently, an oxide or nitride film is deposited over the resulting structure obtained after the formation of the gate electrodes 210. The oxide or nitride film is fully etched back at the entire upper surface thereof, thereby forming spacers on opposite side walls of each gate electrode 210. Using the gate electrodes 210 and spacers 214 as a mask, impurity ions are implanted in exposed upper surface portions of the substrate 200 each arranged between adjacent gate electrodes 210, thereby forming source regions 216a and drain regions 216b of transistors at those surface portions of the substrate 200, respectively.

Next, an insulating layer (not shown) is deposited over the resulting structure formed with the transistors. The insulating layer is then etched back using a photo etch process, thereby forming self-aligned contact holes through which the source and drain regions 216a and 216b of the transistors are exposed, respectively. A conductive layer, for example, a doped polysilicon layer, is then deposited over the resulting structure. The conductive layer is subsequently patterned using a photo-etch process, thereby forming pad electrodes 218a and 218b electrically connected to respective source and drain regions 216a and 216b via associated ones of the self-aligned contact holes. In this case, the pad electrodes 218a and 218b serve to reduce the aspect ratio between first contact holes, which will electrically connect respective drain regions 216b of the transistors to bit lines to be subsequently formed, and second contact holes which will electrically connect respective source regions 216a of the transistors to storage electrodes of capacitors to be subsequently formed.

Subsequently, an insulating material such as an oxide is deposited over the resulting structure obtained after the formation of the pad electrodes 218a and 218b, thereby forming a first interlayer insulating layer 220 adapted to insulate the transistors from bit lines to be subsequently formed. The first interlayer insulating layer 220 is then etched using a photo-etch process, thereby forming first contact holes 222 adapted to expose respective pad electrodes 218b connected to the drain regions 216b of the transistors. A conductive layer 224 such as a doped polysilicon layer is then deposited over the resulting structure. Subsequently, a bit line capping layer 226 such as an oxide film is formed over the conductive layer 224. In accordance with a photo-etch process, the bit line capping layer 226 and conductive layer 224 are then patterned, thereby forming bit lines electrically connected to respective pad electrodes 218b via respective first contact holes 222.

Over the resulting structure obtained after the formation of the bit lines 224, an insulating material such as an oxide is deposited to form a second interlayer insulating layer 230 for insulating the bit lines 224 from respective storage electrodes of the capacitors. A nitride film is then deposited over the second interlayer insulating layer 230, thereby forming an etch barrier layer 232. Subsequently, an insulating material, which exhibits an etch selectivity with respect to the etch barrier layer 232 in an optional wet etch process, is deposited over the etch barrier layer 232. For example, an oxide film 234 is deposited over the etch barrier layer 232.

Next, the oxide film 234, etch barrier layer 232, and second interlayer insulating layer 230 are etched in accordance with a photo etch process so as to form second contact holes 236 for exposing the pad electrodes 218a connected to respective source regions 216a of the transistors. After the formation of the second contact holes 236, contact spacers may be formed on respective inner side walls of the second contact holes 236 by depositing a nitride film over the structure obtained after the formation of the second contact holes 236, and then fully etching back the nitride film.

FIG. 7 shows the formation of storage electrodes 238. For the formation of the storage electrodes 238, a conductive layer is formed over the resulting structure obtained after the formation of the second contact holes 236. For example, a polysilicon layer doped with phosphorous (P) ions is deposited. The conductive layer is then patterned using a photo-etch process, thereby forming first electrodes, namely, storage electrodes 238 of capacitors. Prior to the formation of the conductive layer associated with the storage electrodes 238, contact plugs may be formed by burying a polysilicon layer, doped with phosphorous (P) ions, in the second contact holes 236.

The storage electrodes 238 have a trapezoidal layout with different widths at opposite longitudinal ends thereof, respectively, as shown in FIG. 4. In this case, each second contact hole 236 is arranged such that it is closer to the wider longitudinal end of the associated storage electrode 238.

FIG. 8 shows the formation of capacitors. For the formation of those capacitors, the oxide film 234 left beneath the storage electrodes 238 is first undercut in accordance with a wet etch process after the formation of the storage electrodes 238, thereby allowing the storage electrodes 238 to be exposed at respective lower surfaces thereof. During the undercutting process, the etch barrier layer 232 serves to prevent the second interlayer insulating layer 230 from being etched. Since each storage electrode 238 is exposed at the lower surface thereof, it is possible to obtain a further increase in effective capacitor area.

Subsequently, a dielectric layer 240 and second electrodes 242 of the capacitors, that is, plate electrodes, are laminated over the resulting structure. Thus, the formation of the capacitors on respective memory cell regions is completed. Although not shown, a third interlayer insulating layer made of an oxide is then formed over the resulting structure. Finally, well-known processes for forming metal contacts and metal lines are carried out to complete the manufacture of the DRAM device.

In summary, a preferred layout structure in a semiconductor device can achieve an improvement in the alignment margin between a conductive layer pattern and a contact hole under the conductive layer pattern. A pattern in a semiconductor device has at least one conductive layer pattern electrically connected to a conductive region via a contact hole formed beneath the conductive layer pattern, wherein the conductive layer pattern has different widths at opposite longitudinal ends thereof, respectively.

It is preferable if the conductive layer pattern has a layout configured such that the width at one of the longitudinal ends thereof is larger than the width of the contact hole, and the width at the other longitudinal end thereof is smaller than the width of the one longitudinal end. In addition, the layout of the conductive layer pattern is configured such that the width of the other longitudinal end thereof is smaller than the width of the contact hole.

It is also preferable if the conductive layer pattern is repetitively arranged on the same plane to form an array of conductive layer patterns such that the wider and narrower longitudinal ends of one conductive layer pattern face respective wider and narrower longitudinal ends of another conductive layer pattern adjacent to the one conductive layer pattern. At least one conductive layer pattern electrically is connected to a conductive region via a contact hole formed beneath the conductive layer pattern, wherein the conductive layer pattern has a layout with a trapezoidal structure, and the contact hole is arranged to be closer to a longer side of the trapezoidal structure.

It is additionally preferable if the conductive layer pattern is repetitively arranged to form an array of conductive layer patterns on the same plane such that the longer and shorter sides of one trapezoidal conductive layer pattern face respective longer and shorter sides of another trapezoidal conductive layer pattern adjacent to the one trapezoidal conductive layer pattern.

A preferred layout in a semiconductor device can achieve an improvement in the alignment margin between a capacitor and a contact hole under the capacitor within a given memory cell area. At least one capacitor has a first electrode electrically connected to a conductive region via a contact hole formed beneath the first electrode, and a second electrode laminated over the first electrode such that a dielectric layer is interposed between the first and second electrodes, wherein the first electrode has a layout with different widths at opposite longitudinal ends thereof, respectively.

Further, it is preferable if the first electrode has a layout configured such that the width at one of the longitudinal ends thereof is larger than the width of the contact hole, and the width at the other longitudinal ends thereof is smaller than the width of the one longitudinal end. In addition, the layout of the first electrode is configured such that the width of the other longitudinal end thereof is smaller than the width of the contact hole.

Moreover, it is preferable if the capacitor is repetitively arranged to form an array of capacitors respectively having first electrodes arranged on the same plane such that the wider and narrower longitudinal ends of one first electrode face respective wider and narrow longitudinal ends of another first electrode adjacent to the one first electrode. A pattern in a semiconductor device includes at least one capacitor having a first electrode electrically connected to a conductive region via a contact hole formed beneath the first electrode, and a second electrode laminated over the first electrode such that a dielectric layer is interposed between the first and second electrodes, wherein the first electrode has a layout having a trapezoidal structure, and the contact hole is arranged to be closer to a longer side of the trapezoidal structure.

It is also preferable if the capacitor is repetitively arranged to form an array of capacitors respectively having first electrodes arranged on the same plane such that the longer and shorter sides of one trapezoidal first electrode face respective longer and shorter sides of another trapezoidal first electrode adjacent to the one trapezoidal first electrode.

Although the layout according to the preferred embodiment of the present invention has been described in conjunction with the storage electrodes of capacitors, it may also be applied to an optional conductive layer electrically connected to a layer arranged therebeneath via contact holes.

As apparent from the above description, the preferred embodiment of the present invention provides a layout of a capacitor capable of achieving an improvement in the alignment margin between the capacitor and a contact hole under the capacitor within a given memory cell area. Thus, it is possible to avoid the formation of an inferior storage electrode over a region where the contact hole is formed.

While the preferred embodiment of the present invention has been described in detail with reference to that specific embodiment, it is merely an exemplary application. Thus, it may be clearly understood that one skilled in the art may make many variations within the scope and spirit of the present invention.

What is claimed is:

1. A semiconductor device comprising:
 a plurality of conductive regions; and
 a plurality of conductive elements on a common plane, each element connected to a respective conductive region via a respective contact hole beneath the conductive element, each element defining a trapezoid having a first end in the longitudinal direction and a second end in the longitudinal direction end opposite the first end, the first end defining a first width and the second end defining a second width smaller than the first width, each element oriented such that the first end is opposite the second end of an adjacent element, and the second end is opposite the first end of the adjacent element.

2. The semiconductor device according to claim 1, wherein a distance between the contact hole and the first end is less than a distance between the contact hole and the second end.

3. A semiconductor device comprising:
 a conductive region; and
 a capacitor including
  a first electrode electrically connected to the conductive region via a contact hole beneath the first electrode, the first electrode defining a trapezoid having a first end in the longitudinal direction and a second end in the longitudinal direction opposite the first end, the first end defining a first width and the second end defining a second width different from the first width, wherein the first width is larger than the second width; and a second electrode laminated over the first electrode such that a dielectric element is interposed between the first and second electrodes.

4. The semiconductor device according to claim 3, wherein the first width is larger than a width of the contact hole, and the second width is smaller than the first width.

5. The semiconductor device according to claim 4, wherein the second width is smaller than the width of the contact hole.

6. The semiconductor device according to claim 5, wherein a distance between the contact hole and the first end is less than a distance between the contact hole and second width.

7. A semiconductor device comprising:

a plurality of conductive regions;

a plurality of first electrodes on a common plane, each first electrode connected to a respective conductive region via a respective contact hole beneath the first electrode, each first electrode defining a trapezoid having a first end in the longitudinal direction and a second end in the longitudinal direction opposite the first end, the first end defining a first width and the second end defining a second width smaller than the first width, each first electrode oriented such that the first end is opposite the second end of an adjacent first electrode, and the second end is opposite the first end of the adjacent first electrode; and a second electrode laminated over the first electrodes with a dielectric interposed between the first electrodes and second electrode.

8. The semiconductor device according to claim 7, wherein a distance between the contact hole and the first end is less than a distance between the contact hole and the second end.

9. The layout according to claim 8, wherein the conductive layer is repetitively arranged on a common plane to form an array of conductive layers such that the wider and narrower ends in the longitudinal direction of one conductive layer face respective wider and narrower ends in the longitudinal direction of another conductive layer adjacent to the one conductive layer.

* * * * *